United States Patent [19]

Wadsworth et al.

[11] 3,849,144

[45] Nov. 19, 1974

[54] LIGHT-SENSITIVE COMPOSITIONS COMPRISING POLYMERS CONTAINING DIARYLCYCLOPROPENE MOIETY AND PROCESS OF USING

[75] Inventors: Donald H. Wadsworth; William C. Perkins, both of Rochester, N.Y.

[73] Assignee: Eastman Kodak Company, Rochester, N.Y.

[22] Filed: Aug. 27, 1973

[21] Appl. No.: 392,168

Related U.S. Application Data

[62] Division of Ser. No. 164,044, July 19, 1971, Pat. No. 3,779,989.

[52] U.S. Cl. .................... 96/35.1, 96/33, 96/115 R, 204/159.14, 204/159.18, 260/47 UP

[51] Int. Cl. .......................... G03c 1/68, G03c 1/70

[58] Field of Search ........................ 96/35.1, 115 R; 204/159.14, 159.18

[56] References Cited

UNITED STATES PATENTS

| | | | |
|---|---|---|---|
| 3,647,446 | 3/1972 | Alsup et al. | 96/35.1 |
| 3,782,938 | 1/1974 | De Boer | 96/115 R |

*Primary Examiner*—Ronald H. Smith

*Attorney, Agent, or Firm*—A. H. Rosenstein; Robert W. Hampton

[57] ABSTRACT

A novel class of light-sensitive polymers contain a diarylcyclopropene moiety, such as a diarylcyclopropenium ion or a diarylcyclopropenyl group, directly attached to a phenyl group of a polymer backbone. The polymers are useful in preparing photomechanical images and for other purposes.

24 Claims, No Drawings

LIGHT-SENSITIVE COMPOSITIONS COMPRISING POLYMERS CONTAINING DIARYLCYCLOPROPENE MOIETY AND PROCESS OF USING

This application is a division of our copending application Ser. No. 164,044, filed July 19, 1971, now U.S. Pat. No. 3,779,989.

This invention relates to photographic reproduction. In a particular aspect it relates to novel light-sensitive polymers and the use of such polymers in the preparation of photographic and photomechanical images.

It is known in the photographic art to reproduce images by processes which involve imagewise exposure of a layer of a radiation-sensitive material to modify the physical characteristics of the material in areas of the layer which have been exposed. Among the radiation-sensitive materials which have been used in such processes are light-sensitive polymers which are insolubilized or hardened on exposure to actinic radiation. The resulting difference in physical properties between exposed and unexposed areas can be employed to prepare images by such procedures as application of mechanical pressure, application of heat, treatment with solvents, and the like. Thus, the layer can be treated with a solvent for the unhardened polymer, which is a non-solvent for the hardened polymer, thereby removing unhardened polymer and leaving an image of hardened polymer. Alternatively, the layer can be heated to a temperature which is between the tackifying points of the material in unexposed areas of the layer and material in exposed areas of the layer and then the lower melting material can be toned with colored powder or transferred to a receiving surface. Such processes have been employed to prepare lithographic printing plates, stencils, photoresists, and similar photographic and photomechanical images.

The different applications in which light-sensitive polymers are used requires that such polymers be available with a variety of photographic and physical characteristics. Hence, there is a continual search for novel light-sensitive polymers which improve upon and differ from existing light-sensitive polymers.

In DeBoer U.S. Pat. Application Ser. No. 831,242 filed Jun. 6, 1969, now abandoned, there is described a novel class of light-sensitive polymers which have appended to a polymer backbone as the light sensitive moiety, an unsaturated cyclic group such as a cyclopropenyl group. The polymers of the DeBoer application, unlike prior art polymers, contain the unsaturation which contributes to the light sensitivity of the polymer in a cyclic group rather than in a linear chain. Such polymers have good stability under storage condition, make efficient use of incident radiation, and can be highly sensitized, even to radiation in the visible region of the spectrum. While these polymers provide certain advantages over prior art polymers, the cyclopropene compounds used to prepare certain of them entail difficult preparative procedures and are relatively expensive. Furthermore, many of these polymers have limited solubility in many solvent systems.

We have found a novel group of light-sensitive polymers containing the cyclopropene moiety which can be prepared from inexpensive, readily available starting materials by simple, high yield syntheses. A great variation can be realized in the cyclopropene moiety and a large variety of polymeric backbones can be employed, with only minor alterations in the preparative procedures. Thus, polymers having different degrees of light-sensitivity and different solubilities in a variety of coating solvents can be prepared with the processes of the present invention.

It is an object of this invention to prepare a novel class of light-sensitive polymers containing the cyclopropene group.

It is a further object of this invention to provide a novel process for preparing light-sensitive polymers containing the cyclopropene group.

It is yet a further object of this invention to provide novel light-sensitive compositions and elements employing light-sensitive polymers containing the cyclopropene group.

It is another object of this invention to provide processes for preparing photomechanical images with the novel light-sensitive polymer compositions and elements of this invention.

The above and other objects of this invention will become apparent to those skilled in the art from the further description of the invention which follows.

The novel light-sensitive polymers of the present invention have a backbone which is the residue of a polymer containing an activated phenyl group and have directly attached to the phenyl group, as the light-sensitive moiety, a diarylcyclopropene moiety, which can be either a diarylcyclopropenium ion or a diarylcyclopropenyl group. The phenyl group can be appended to the polymer backbone or it can form a part of the polymer backbone.

The polymers of the present invention can be prepared by a process which involves reacting a polymer containing an activated phenyl group with a chloro cyclopropenium tetrachloroaluminate, so as to replace one of the chloro groups of the cyclopropenium compound with the phenyl group of the polymer. The chloro cyclopropenium compound can be a trichlorocyclopropenium tetrachloroaluminate, a dichloromonoarylcyclopropenium tetrachloroaluminate or monochlorodiarylcyclopropenium tetrachloroaluminate. If the cyclopropenium compound used in this substitution reaction is one which has two or more chloro groups on the cyclopropene ring, the resulting polymer is then reacted with sufficient activated aryl compound to replace the remaining chloro groups on the cyclopropene ring. The resulting ionic polymer is light sensitive and can be employed in light-sensitive compositions and elements. Alternatively, the cyclopropenium ion on the polymer can be reduced to the corresponding cyclopropenyl group by reduction with an amine borane reducing agent.

By the term "activated phenyl group" or "activated aryl group" is meant to a group which is susceptible to electrophilic attack. The activated phenyl group on the polymer backbone can be activated by the polymer backbone itself, such as the aliphatic backbone of a polyvinyl addition polymer, it can be activated by a group in the polymer backbone, such as the oxo group in certain condensation polymers, or it can be activated by an electron donating substituent, as defined below, on the phenyl group. The activated aryl groups which are reacted with the cyclopropene moiety of the polymer can be activated by a substituent which is electron donating, either from the standpoint of inductive effects or reasonance effects. Examples of such activating groups are alkyl, alkoxy, aryloxy, aralkoxy, carbonyloxy, hydroxy, chloro, and the like. As used herein, the term "activating groups" denotes a group which rendes the aryl group susceptive to electrophilic attack.

Polymers of the present invention can be represented by the following general structural formulae:

I.
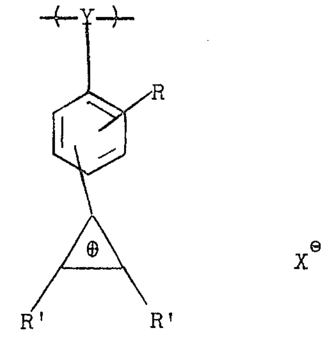

II.
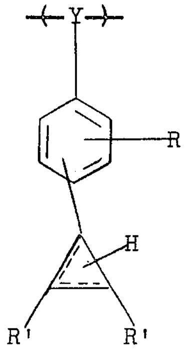

III.
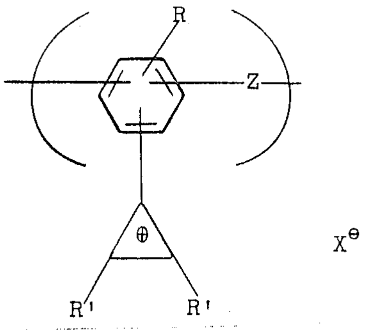

IV.
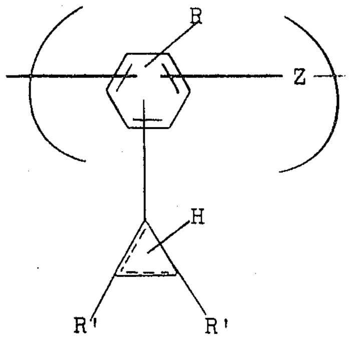

Formula I represents an ionic polymer where the activated phenyl group is pendant from the polymer backbone. Formula II represents the covalent polymer derived from the ionic polymer of Formula I. Formula III represents an ionic polymer wherein the activated phenyl group forms a part of the polymer backbone and Formula IV represents the covalent polymer derived from the ionic polymer of Formula III. In the structural formulae, Y represents a repeating unit of the polymer backbone; Z represents an activating group contained in the polymer backbone; R represents hydrogen or an activating group such as halogen, e.g., chlorine; alkyl or one to eight carbon atoms, e.g., methyl, ethyl, propyl, butyl, amyl, hexyl, heptyl, octyl; aldoxy of one to eight carbon atoms, e.g., methoxy, ethoxy, propoxy, butoxy, amyloxy, hexyloxy, heptyloxy, octyloxy; mono or bicyclic aryloxy such as phenoxy, substituted phenoxy, naphthoxy, substituted naphthoxy, etc.; and the like; R′ represents an aryl group such as a mono or bicyclic aryl group, e.g., phenyl, naphthyl, which can be unsubstituted or substituted with one or more activating groups as defined for R; and $X^{\ominus}$ represents an unidentate anion derived from a metal of groups I*b*, II*b* III*a*, IV*a* or V*a* of the Periodic Table, such as tetrachloroaluminate, trichlorozincate, tetrahaloborate, e.g., trichloromonofluoroborate, tetrafluoroborate, etc., and the like.

A variety of starting polymers can be employed to form the backbone of the light-sensitive polymers of this invention. These can be addition polymers or condensation polymers which contain an activated phenyl group. Suitable polymers include polystyrene and poly(phenyl acrylate) or their substituted derivatives including copolymers of styrene or phenyl acrylate with a variety of vinyl monomers such as acrylates, methacrylonitrile, etc., so long as at least 30 percent of the repeating units of the polymer are styrene or phenylacrylate units; poly(phenyl ethers) with or without further substituents; various polycarbonates, such as those derived from bisphenol A and a variety of glycols; various polyesters, e.g., poly[ethylene: 4,4′-isopropylidenebis(-phenylene) terephthalate]. In general, any polymer or copolymer containing an activated aryl group appended to or forming a part of a polymeric backbone would be useful in the practice of the present invention. With certain of the polymers, such as polycarbonates and polyesters, it may be desirable to protect the ester bond to prevent cleavage during the reaction. This can be accomplished by operating at temperatures between 0° and 30°C. With others of the polymers, such as the acrylate copolymers of styrene, it is desirable to add an excess of a compound such as aluminum trichloride, boron trifluoride, zinc chloride or another strong Lewis acid. It is believed that such compounds preferentially coordinate with the ester group on the polymer, thus making the cyclopropenium compound available for reaction wih the activated aryl group.

The trichlorocyclopropenium compound used to prepare the light sensitive polymer and which provides the light sensitive moiety of the polymer is preferably trichlorocyclopropenium tetrachloroaluminate. Such compounds can be readily prepared by the procedure described in West, Sado and Tobey, Journal of the American Chemical Society, Vol. 88, page 2,244 (1966) which involves warming tetrachlorocyclopropene with aluminum chloride. Corresponding trichloropropenium salts can be prepared by substituting for aluminum trichloride other strong Lewis acids such as antimony pentachloride, iron trichloride or gallium trichloride. From the 1,2,3-trichlorocyclopropenium ion, aryl-substituted chlorocyclopropenium ions, such as the 1-phenyl-2,3-dichlorocyclopropenium ion and the 1,2-diphenyl-3-chlorocyclopropenium ion can be prepared by reaction with equimolar or excess amounts of benzene at low or moderate temperatures. Such preparation is described in West, Zecher and Goyert, Journal of the American Chemical Society, Vol. 92, page 149 (1970).

As indicated above, the final substitution of the chloro group on the cyclopropenium ion is with an activated aryl compound. Suitable activated aryl compounds are those containing activating substituents and include such compounds as anisole, phenol, 2,6-di-t-butylphenol, naphthol, mesitylene, naphthalene and the like.

In general, the initial substitution of the 1,2,3-trichlorocyclopropenium ion should be with a less active aryl compound such as benzene, toluene, or polystyrene, this first stage substitution should also be performed at relatively low temperatures and will proceed fairly rapidly. As the second and third substituents are added to the cyclopropenium ion more active aryl reactants should be employed such as anisole, phenol, etc. and the temperature and time of reaction should be increased. Similarly, with the first and second stage reactions, equimolar amounts of the aryl reactant should be employed, because the driving force of a molar excess is not required and to prevent more than one chloro group being replaced. For the third stage reaction it is desirable to use molar excess of the aryl reactant so as to drive the reaction to completion.

The solvents used in the reaction generally should be relatively inert and should not be more nucleophilic than solvents containing nitro groups, that is, they should not contain groups such as carbonyl groups, ester groups, alcohol groups, and the like which are rich in electrons, since these solvents tend to deactivate the cyclopropenium ion and inhibit its reaction with the aryl compound. Suitable relatively inert solvents include chlorinated or nitrated aliphatic or aromatic hydrocarbons, such as dichloromethane, dichloroethane, chlorobenzene, nitromethane, nitrobenzene and the like. It is often desirable to employ a nitrated hydrocarbon either alone or in conjunction with another solvent when the polymer containing the active aryl group is reacted with a trichlorocyclopropenium compound or when it is reacted with a dichlorocyclopropenium compound at room temperature or above. Since the nitrated hydrocarbon tends to deactivate the cyclopropenium ion to a certain extent, its presence in the reaction mixture reduces the possibility of more than one chloro group on the cyclopropenium ion being replaced by the polymer.

The reaction is typically performed at a temperature in he range of 0° to about 85°C. Generally, lower temperatures are employed with more active reactants and in the early stage reactions, whereas higher temperatures are employed with the less active reactants and during later stage reactions. The time required for the reaction similarly will vary with the stage of the reaction, the activity of the reactants, and the temperature at which the reaction is carried out. The completion of a particular stage of reaction will be evidenced by a diminution or a cessation of the evolution of hydrogen chloride.

The ionic polymer which results from the third stage reaction is light sensitive and can be collected by standard preparative techniques such as precipitation, filtration and the like and used in the preparation of light-sensitive compositions and elements. However, it is preferred that the ionic polymer be reduced to the corresponding covalent polymer by adding to the reaction mixture an amine borane reducing agent. Surprisingly, it has been found that reducing agents, such as borohydrides and the like, which typically are employed to reduce monomeric cyclopropenium ions to cyclopropenyl compounds, are not effective as reducing agents for the ionic polymer, but that amine boranes readily reduce the ionic polymer to the corresponding covalent polymer. Reduction can be carried out at room temperature employing a slight molar excess of the reducing agent.

Suitable amine-borane reducing agents include alkylamine boranes, such as dimethylamine borane, trimethylamine borane, diethylamine borane, triethylamine borane, t-butylamine borane, dimethyldodecylamine borane, dimethyloctadecylamine borane, diisooctylamine borane, and the like, as well as heterocyclic amine boranes such as pyridine borane, picoline borane, morpholine borane, and the like. The amine borane reducing agents can be either isolated and purified before addition to the polymer solution, or it can be formed from the appropriate amine hydrochloride and sodium borohydride and added directly to the polymer solution without isolation.

An alternative although less preferred and less effective procedure for reducing the ionic polymer to the corresponding covalent polymer involves the addition of a nucleophile such as a methoxy ion, or a cyano ion, thereby converting the cyclopropenium ion to the corresponding methoxy- or cyanocyclopropenyl group.

The polymers of the present invention typically have inherent viscosities of 0.25 or higher. As would be expected, the inherent viscosity of a particular polymer of the present invention will depend on the starting polymer employed, the degree of substitution of that polymer with cyclopropene groups, the substituents on the cyclopropene group, and the like. For use in photosensitive compositions and elements, it is preferred that the polymers of this invention have an inherent viscosity in the range of 0.5 to 3.0.

Coating compositions containing the light sensitive polymers of this invention can be prepared by dispersing or dissolving the polymer in any suitable solvent or combination of solvents used in the art to prepare polymer dopes. Solvents that can be used to advantage include ketones such as 2-butanone, 4-methyl-2-pentanone, cyclohexanone, 4-butyrolactone, 2,4-pentandione, 2,5-hexandione, etc.; esters such as 2-ethoxyethyl acetate, 2-methoxyethyl acetate, n-butyl acetate, etc.; chlorinated solvents such as chloroform, dichloroethane, trichloroethane, tetrachloroethane, etc.; as well as N,N-dimethylformamide and dimethyl sulfoxide; and mixtures of these solvents. Typically the light-sensitive polymer is employed in the coating composition in the range from about 1 to 20 percent by weight. Preferably the polymer comprises 2 to 10 percent by weight of the composition in a solvent such as listed above. The coating compositions also can include a variety of photographic addenda utilized for their known purpose, such as agents to modify the flexibility of the coating, agents to modify its surface characteristics, dyes and pigments to impart color to the coating, agents to modify the adhesivity of the coating to the support, antioxidants, preservatives, and a variety of other addenda known to those skilled in the art.

The coating compositions can be sensitized with such sensitizers as pyrylium and triapyrylium dye salts, thiazoles, benzothiazolines, naphthothiazolines, quinolizones acridones, cyanine dyes, dithiolium salts, Michler's ketone, Michler's thioketone, and the like sensitizers. When a sensitizer is employed, it can be present in amounts of about 0.1 to 10 percent by weight of the light-sensitive polymer, and it is preferably employed in the range of about 0.2 to 5 percent by weight of the light-sensitive polymer.

The light-sensitive polymer of this invention can be the sole polymeric constituent of the coating composition or another polymer can be incorporated therein to modify the physical properties of the composition and serve as a diluent. For example, phenolic resins, such as thermoplastic novolac resins or solvent-soluble resole resins can be incorporated in the composition to improve the resistance of the polymer composition to etchants when it is used as a photoresist. Similarly, hydrophilic polymers such as cellulose and its derivatives, poly-(alkylene oxides), poly(vinyl alcohol) and its derivatives, and the like can be incorporated in the composition to improve the hydrophilic properties of the coating when it is used in the preparation of lithographic printing plates. These other polymeric materials can constitute up to 25 percent by weight of the polymeric components of the coating composition.

Photosensitive elements can be prepared by coating the photosensitive compositions from solvents onto supports in accordance with usual practices. Suitable support materials include fiber base materials such as paper, polyethylene-coated paper, polypropylene-coated paper, parchment, cloth, etc.; sheets and foils of such metals as aluminum, copper, magnesium, zinc, etc.; glass and glass coated with such metals as chromium, chromium alloys, steel, silver, gold, platinum, etc.; synthetic polymeric materials such as poly(alkyl methacrylates), e.g., poly(methyl methacrylate), polyester film base, e.g., poly-(ethylene terephthalate), poly(vinyl acetals), polyamides, e.g., nylon, cellulose ester film base, e.g., cellulose nitrate, cellulose acetate, cellulose acetate propionate, cellulose acetate butyrate, and the like. The optimum coating thickness for a particular purpose will depend upon such factors as the use to which the coating will be put, the particular light-sensitive polymer employed, and the nature of other components which may be present in the coating. Typical coating thicknesses can be from about 0.1 to 10 mils.

Photomechanical images can be prepared with photosensitive elements by imagewise exposing the element to a light source to harden or insolubilize the polymer in exposed areas. Suitable light sources which can be employed in exposing the elements include sources rich in visible radiation and sources rich in ultraviolet radiation, such as carbon arc lamps, mercury vapor lamps, fluorescent lamps, tungsten lamps, photoflood lamps, and the like.

The exposed element can be developed with a solvent for the unexposed, uncrosslinked polymer which is a non-solvent for the exposed hardened polymer. Such solvents can be selected from the solvents listed above as suitable coating solvents as well as others.

The following examples further illustrate this invention.

Example 1

1,2,3-trichlorocyclopropenium tetrachloroaluminate is stirred with an excess of cooled (approximately 10°C.) benzene until hydrogen chloride evolution subsides. Excess benzene is stripped from the reaction mixture and the residual tan solid dissolved in 1,2-dichloroethane. An amount of polystyrene equivalent to that required for the desired degree of substitution is added to the solution and the mixture is refluxed (approximately 80°C) for 5 hours until evolution of hydrogen chloride gas ceases. To collect the ionic polymer, the reaction mixture is dissolved in excess methanol and treated with excess 48 percent fluoroboric acid to precipitate the polymer. Filtration and air drying furnishes a 70–90 percent yield of poly[2,3-diphenyl-1-(4-vinylphenyl)cyclopropenium fluoroborate]. The structure is verified by infrared spectral analysis. In a representative run, a polymer containing 1-cyclopropenium ion for each eight styrene units has the following elemental analysis:

Analysis Calculated: C, 85.6; H, 6.6; B, 1.0; F, 6.8
Found: C, 85.5; H, 6.6; B, 1.0; F, 7.0

To prepare the corresponding covalent polymer, the solution of ionic polymer in 1,2-dichloroethane is treated with 5–10 volume percent methanol or N,N-dimethylformamide and a slight molar excess of dimethylamine borate. Upon pouring the resulting solution into rapidly stirred methanol, copoly(styrene-4-(2,3-diphenylcyclopropenyl)styrene] is obtained in 70–100 percent yield. Analysis of the degree of substitution of these polymers is accomplished by infrared or ultraviolet spectroscopy. The quantitative comparison of intensities of characteristic absorption bands of appropriate model compounds (1,2,3-triphenylcyclopropene, anisyldiphenylcyclopropene, dianisylphenylcyclopropene, etc.) with corresponding absorption bands of their polymeric counterparts are recorded as weight percent model compound. Substitution data is then obtained from a graph of "number of units substituted" vs. "weight percent model compound." Table I summarizes data obtained from several representative polymers.

Example 2

Example 1 is repeated substituting poly(phenyl ether) for the polystyrene in the second stage reaction. Copoly(2,3-diphenylcyclopropenylphenyl ether-phenyl ether) is obtained in good yield.

Example 3

1,2,3-Trichlorocyclopropenium tetrachloroaluminate suspended in cold (approximately 0°C.) 1,2-dichloroethane is treated with 1.1 molar equivalents of benzene. The reaction mixture is stirred at 5°C until hydrogen chloride evolution ceases and then is allowed to warm to room temperature. Polystyrene (one molar equivalent) is dissolved in the solution and stirred at room temperature until hydrogen chloride gas evolution ceases. The addition of an excess of anisole results in further hydrogen chloride evolution, and completes the substitution reaction. The reaction mixture is processed as in Example 1 to furnish either copoly[2-anisyl-3-phenyl-1-(4-vinylphenyl) cyclopropenium fluoroborate-styrene] or copoly[4-(2-anisyl-3-phenylcyclopropenyl)styrene-styrene].

Example 4

A solution of 1,2,3-trichlorocyclopropenium tetrachloroaluminate in nitromethane is mixed with a 2–10 percent solution of polystyrene in 1,2-dichloroethane. After a reaction time of from 5 to 30 minutes at 0° to 25°C., the mixture is treated with an excess of anisol, stirred at room temperature (approximately 25°C) for 5 minutes, and heated to 70°C to complete the reaction (determined by cessation of hydrogen chloride evolution). Processing the reaction mixture as in Example 1 yields copoly[p-(2,3-dianisylcyclopropenyl)styrene-styrene]. The amount of unsubstituted styrene units in the polymer is determined spectroscopically by quantitative comparison of the intensities of characteristic absorption bands of the polymers in question and of polystyrene. Residual polystyrene is then related graphically to the substitution ratio. Representative polymers are shown in Table I.

Example 5

A solution of 1,2,3-trichlorocyclopropenium tetrachloroaluminate and an equimolar amount of aluminum chloride in nitromethane is mixed with a 2 to 10 percent solution of poly(phenyl acrylate). The mixture is allowed to react at 0° to 10°C for from 5 to 30 minutes after which it is treated with an excess of anisole, stirred at room temperature, and then heated to complete the reaction. Processing the reaction mixture as in Example 1 yields copoly[4-(2,3-dianisylcyclopropenyl)phenyl acrylate phenyl acrylate].

Example 6

A solution of 1,2,3-trichlorocyclopropenium tetrachloroaluminate and an equimolar amount of aluminum chloride is dissolved in 1,2-dichloroethane and mixed with a 2 to 10 percent solution of copoly(methyl methacrylate-styrene). With higher viscosity polymers some nitromethane must be added to the reaction mixture to maintain complete solution during the course of the reaction. The resulting solution is stirred at temperatures ranging from 0° to 50°C. for 2 to 24 hours, treated with an excess of anisole, and processed as in Example 1 to furnish copoly[4-(2,3-dianisylcyclopropenyl)styrene-methylmethacrylate-styrene]. The products are analyzed spectroscopically as described in Example 4. Several representative polymers are described in Table I.

Example 7

Copoly[p-(2-anisyl-3-phenylcyclopropenyl)styrene-methylmethacrylate-styrene] is prepared by the procedure described in Example 3 by employing the following three variations:

1. The solution of 1,2-dichloro-3-phenylcyclopropenium tetrachloroaluminate is treated with a molar equivalent of aluminum chloride before mixing with the polymer solution.
2. Copoly(methylmethacrylate-styrene) is substituted for polystyrene.
3. Prolonged reaction times of up to 24 hours are employed to obtain a high degree of substitution. All other features of the preparative method and workup are as described in Example 3.

Example 8

A 15 percent solution of trichlorocyclopropenium tetrachloroaluminate in a 50:50 by volume mixture of nitromethane and 1,2-dichloroethane is heated to 50°C and mixed with a 10 percent 1,2-dichloroethane solution of one molar equivalent of copoly-(methacrylonitrile-styrene). The mixture is heated at 50°–60°C for about 35 minutes then treated with an excess of anisole. After heating for another 35–40 minutes the solution is treated with N,N-dimethylformamide and one molar equivalent of amine borane and processed as in Example 1. The resulting copoly[4-(2,3-dianisylcyclopropenyl)styrene-methacrylonitrile-styrene] is obtained in a quantitative yield based on substitution of one-half of the aromatic rings of the parent polymer.

Example 9 - Sensitometric Evaluation

Cyclopropenium and cyclopropenyl polymers prepared in the preceding examples exhibit a range of light sensitivities, depending on structure, molecular weight, and degree of substitution. Solutions containing 2 percent of the polymers shown in Table I and 0.1 percent by weight of the sensitizer 2-benzoylmethylene-1-methyl-β-naphthothiazoline in 1,2-dichloroethane are coated and evaluated. The sensitometric data obtained are shown in Table I. The sensitivity values are determined by the procedure of L. M. Minsk et al., "Photosensitive Polymers, I and II," *Journal of Applied Polymer Science*, Vol. II, No. 6. pp. 302–311 (1959). Sensitivity value is a measure of the relative speed of the polymer compared with the speed of unsensitized poly(vinyl cinnamate) as a standard. Trichloroethylene is used as the developing solvent.

Table I

| Example No. / Polymer[1] | Weight Percent of Repeating Units Having Appended Chromophores (Determine by UV or IR analysis) | Weight Percent of Residual Polystyrene (Units not containing appended chromophores) (Determined by UV analysis) | Number of Chromophores per two-carbon atom repeating unit in the polymer backbone | Inherent Viscosity[3] {n} | Sensitivity Value |
|---|---|---|---|---|---|
| —/I | — | — | — | — | 2 |
| I/II | — | — | — | 0.3 | 300 |
| 1/III | 57.5 | — | 1/3 | 0.3 | 150 |
| 1/III | 68.0 | — | 1/2 | 0.3 | 2,500 |
| 1/III | 37.0 | — | 1/5 | 0.78 | 3,500 |
| 1/III | 41.2 | — | 1/4.5 | 0.78 | 7,000 |
| 1/III | 47.0 | — | 1/3.7 | 0.78 | 12,000 |
| 1/III | 57.2 | — | 1/3 | 0.78 | 22,000 |
| 1/III | 68.3 | — | 1/2 | 0.78 | 50,000 |
| 3/VIII[2] | — | — | 1/3 | 1.0 | 3,000 |
| 4/IV | — | 8.9 | 3/4 | 0.78 | 9,000 |
| 4/IV | — | 6.8 | 4/5 | 0.78 | 12,000 |
| 6/V | — | 35.2 | 1/6 | 1.8 | 7,000 |
| 6/V | — | 39.5 | 1/8 | 2.4 | 12,000 |
| 7/VI | 11.9 | — | 1/14 | 2.0 | 300 |
| 7/VI | 19.2 | — | 1/8.5 | 2.0 | 1,200 |
| 7/VI | 22.4 | — | 1/7 | 2.0 | 3,500 |
| 7/VI | 26.2 | — | 1/5.7 | 2.0 | 12,000 |

Table I – Continued

| Example No. Polymer[1] | Weight Percent of Repeating Units Having Appended Chromophores (Determine by UV or IR analysis) | Weight Percent of Residual Polystyrene (Units not containing appended chromophores) (Determined by UV analysis) | Number of Chromophores per two-carbon atom repeating unit in the polymer backbone | Inherent Viscosity[3] {n} | Sensitivity Value |
|---|---|---|---|---|---|
| 7/VI | 31.4 | — | 1/4.3 | 2.0 | 22,000 |
| 8/VII | — | — | — | very high | 30,000 |

1. Polymer I = Poly(vinyl cinnamate) (prepared as described in Minsk U.S. Patent 2,725,372)
Polymer II = Copoly[styrene-1,2-diphenyl-3-(p-vinylphenyl)cyclopropenium fluoroborate]
Polymer III = Copoly[styrene-p-(2,3-diphenylcyclopropenyl)-styrene]
Polymer IV = Copoly[styrene-p-(2,3-dianisylcyclopropenyl)styrene]
Polymer V = Copoly[styrene-p-(2,3-dianisylcyclopropenyl)styrene-methyl methacrylate]
Polymer VI = Copoly[p-(2-anisyl-3-phenylcyclopropenyl)styrene-methyl methacrylate-styrene]
Polymer VII = Copoly[styrene-p-(2,3-dianisylcyclopropenyl)styrene-methacrylonitrile]
Polymer VIII = Copoly[p-(2-methoxynaphthylene-3-phenylcyclopropenyl)styrene-styrene]
2. Prepared as in Example 3 except substituting 2-methoxynaphthalene for anisole.
3. All inherent viscosities were determined at 25°C in a 1:1 by weight solvent mixture of phenol: chlorobenzene at a concentration of 0.25 g. polymer/100 cc solution.

The invention has been described in detail with particular reference to certain preferred embodiments thereof, but it will be understood that variations and modifications can be effected within the spirit and scope of the invention.

We claim:

1. A light-sensitive composition comprising a light-sensitive polymer having a backbone which is the residue of a polymer comprised of repeating units at least 30 percent of which are characterized by containing an activated phenyl group and having attached directly to said phenyl group a diarylcyclopropene moiety, and a solvent for said light-sensitive polymer.

2. A light-sensitive composition according to claim 1 wherein said diarylcyclopropene moiety of said light-sensitive polymer is a diarylcyclopropenium ion.

3. A light-sensitive composition according to claim 1 wherein said diarycyclopropene moiety of said light-sensitive polymer is a diarylcyclopropenyl group.

4. A light-sensitive composition according to claim 1 wherein said backbone of said light-sensitive polymer is the residue of a polystyrene.

5. A light-sensitive composition according to claim 4 wherein said diarylcyclopropene moiety of said light-sensitive polymer is a diphenylcyclopropene moiety.

6. A light-sensitive composition according to claim 1 in which said light-sensitive polymer comprises from 1 to 20 percent by weight of said composition.

7. A light-sensitive composition according to claim 1 additionally including a sensitizer for said light-sensitive polymer.

8. A light-sensitive composition according to claim 7 in which said sensitizer is a thiazoline.

9. A light-sensitive composition according to claim 8 in which said sensitizer is 2-benzoylmethylene-1-methyl-β-naphthothiazoline.

10. A light-sensitive composition according to claim 1 in which said light-sensitive polymer is copoly-[styrene-(2,3-diarylcyclopeopenyl)styrene] in which at least 30 percent of all styrene repeating units present are (2,3-diarylcyclopropenyl)-styrene repeating units.

11. A light-sensitive composition according to claim 1 in which said light-sensitive polymer is copoly-[styrene-4-(2,3-diphenylcyclopropenyl)-styrene] in which at least 30 percent of all styrene repeating units present are 4-(2,3-diphenylcyclopropenyl)styrene units.

12. A light-sensitive composition according to claim 1 in which said light-sensitive polymer is copoly-[styrene-4-(2,3-dianisylcyclopropenyl)-styrene] in which at least 30 percent of all styrene repeating units present are 4-(2,3-dianisylcyclopropenyl)styrene repeating units.

13. A light-sensitive composition according to claim 1 in which said light-sensitive polymer is copoly-[styrene-4-(2-anisyl-3-phenylcyclopropenyl)styrene] in which at least 30 percent of all styrene repeating units present are 4-(2-anisyl-3-phenylcyclopropenyl)styrene repeating units.

14. A light-sensitive composition according to claim 1 in which said solvent is a chlorinated aliphatic hydrocarbon.

15. A light-sensitive composition according to claim 14 in which said solvent is dichloroethane or trichloroethane.

16. A photographic element comprising a light-sensitive layer comprised of a light-sensitive polymer having a backbone which is the residue of a polymer comprised of repeating units at least 30 percent of which are characterized by containing an activated phenyl group and having attached directly to said phenyl group a diarylcyclopropene moiety and a support for said light-sensitive layer.

17. A photographic element according to claim 16 in which said diarylcyclopropene moiety of said light-sensitive polymer is a diarylcyclopropenium ion.

18. A photographic element according to claim 16 in which said diarylcyclopropene moiety of said light-sensitive polymer is a diarylcyclopropenyl group.

19. A photographic element according to claim 16 in which said backbone of said light-sensitive polymer is the residue of a polystyrene.

20. A photographic element according to claim 19 in which said diarylcyclopropene moiety of said light-sensitive polymer is a diphenylcyclopropene moiety.

21. A photographic element according to claim 1 in which said light-sensitive layer additionally includes a sensitizer.

22. A photographic element according to claim 21 in which said sensitizer is a thiazoline.

23. A photographic element according to claim 22 in which said sensitizer is 2-benzoylmethylene-1-methyl-β-naphthothiazoline.

24. A process for preparing an image which comprises exposing to a pattern of actinic radiation the photographic element of claim 16 to insolubilize the light-sensitive layer in exposed areas and developing an image by removing the light-sensitive layer from unexposed areas with a solvent therefor which is a non-solvent for exposed portions of the light-sensitive layer.

* * * * *

PO-1050
(5/69)

UNITED STATES PATENT OFFICE
CERTIFICATE OF CORRECTION

Patent No. 3,849,144 Dated Nov. 19, 1974

Inventor(s) Donald H. Wadsworth and William C. Perkins

It is certified that error appears in the above-identified patent and that said Letters Patent are hereby corrected as shown below:

Col. 4, line 1, change "or" to --of--; Line 3, change "aldoxy" to --alkoxy--.

Col. 5, line 44, change "he" to --the--.

Col. 6, line 61, change "triapyrilium" to -- thiapyrylium --; Line 63, after "zones" insert --,--.

Signed and sealed this 10th day of June 1975.

(SEAL)
Attest:

RUTH C. MASON
Attesting Officer

C. MARSHALL DANN
Commissioner of Patents
and Trademarks